US011482447B2

(12) United States Patent
Tien et al.

(10) Patent No.: US 11,482,447 B2
(45) Date of Patent: Oct. 25, 2022

(54) METHOD OF FORMING AN INTEGRATED CHIP HAVING A CAVITY BETWEEN METAL FEATURES

(71) Applicant: Taiwan Semiconductor Manufacturing Co., Ltd., Hsin-Chu (TW)

(72) Inventors: Hsi-Wen Tien, Xinfeng Township (TW); Chung-Ju Lee, Hsinchu (TW); Chih Wei Lu, Hsinchu (TW); Hsin-Chieh Yao, Hsinchu (TW); Shau-Lin Shue, Hsinchu (TW); Yu-Teng Dai, New Taipei (TW); Wei-Hao Liao, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/923,424

(22) Filed: Jul. 8, 2020

(65) Prior Publication Data

US 2022/0013403 A1 Jan. 13, 2022

(51) Int. Cl.
*H01L 21/768* (2006.01)
*H01L 21/8234* (2006.01)
(Continued)

(52) U.S. Cl.
CPC .... *H01L 21/7682* (2013.01); *H01L 21/76811* (2013.01); *H01L 21/76828* (2013.01);
(Continued)

(58) Field of Classification Search
CPC .............. H01L 21/7682; H01L 21/764; H01L 2221/1042–1047; H01L 21/76897;
(Continued)

(56) References Cited

U.S. PATENT DOCUMENTS 6,287,979 B1 * 9/2001 Zhou .................... B82Y 10/00
438/723
7,329,613 B2 2/2008 Furukawa
(Continued)

OTHER PUBLICATIONS

Stine et al. "Formation of Primary Amines on Silicon Nitride Surfaces: A Direct, Plasma-Based Pathway to Functionalization." Langmuir 2007, 23, 4400-4404, published Feb. 27, 2007.
(Continued)

*Primary Examiner* — Younes Boulghassoul
(74) *Attorney, Agent, or Firm* — Eschweiler & Potashnik, LLC

(57) ABSTRACT

The present disclosure relates to an integrated chip. The integrated chip comprises a dielectric layer over a substrate. A first metal feature is over the dielectric layer. A second metal feature is over the dielectric layer and is laterally adjacent to the first metal feature. A first dielectric liner segment extends laterally between the first metal feature and the second metal feature along an upper surface of the dielectric layer. The first dielectric liner segment extends continuously from along the upper surface of the dielectric layer, to along a sidewall of the first metal feature that faces the second metal feature, and to along a sidewall of the second metal feature that faces the first metal feature. A first cavity is laterally between sidewalls of the first dielectric liner segment and is above an upper surface of the first dielectric liner segment.

20 Claims, 11 Drawing Sheets

(51) Int. Cl.
  *H01L 23/528* (2006.01)
  *H01L 23/532* (2006.01)
  *H01L 23/522* (2006.01)
(52) U.S. Cl.
  CPC .......... *H01L 21/76834* (2013.01); *H01L 21/823475* (2013.01); *H01L 23/5222* (2013.01); *H01L 23/5283* (2013.01); *H01L 23/53295* (2013.01)
(58) Field of Classification Search
  CPC ......... H01L 21/76808; H01L 21/76814; H01L 21/76828; H01L 21/76802–76817; H01L 23/5283; H01L 23/5222; H01L 29/0649–0653; H01L 21/823475; H01L 21/823871; H01L 21/76834; H01L 23/5226; H01L 23/53295
  See application file for complete search history.

(56) References Cited

U.S. PATENT DOCUMENTS

| | | | | |
|---|---|---|---|---|
| 9,281,277 | B2* | 3/2016 | Baek | H01L 21/7684 |
| 9,390,965 | B2 | 7/2016 | Yang et al. | |
| 2008/0182403 | A1* | 7/2008 | Noori | H01L 21/7682 |
| | | | | 438/618 |
| 2009/0093100 | A1* | 4/2009 | Xia | H01L 21/76807 |
| | | | | 438/421 |
| 2009/0302475 | A1* | 12/2009 | Korogi | H01L 23/53295 |
| | | | | 257/761 |
| 2010/0001409 | A1 | 1/2010 | Humbert | |
| 2010/0093168 | A1* | 4/2010 | Naik | H01L 21/7682 |
| | | | | 438/618 |
| 2012/0261788 | A1* | 10/2012 | Lin | H01L 23/528 |
| | | | | 257/506 |
| 2015/0179582 | A1* | 6/2015 | Baek | H01L 21/7682 |
| | | | | 257/751 |
| 2015/0287682 | A1* | 10/2015 | Ahn | H01L 21/76832 |
| | | | | 257/773 |
| 2016/0293547 | A1* | 10/2016 | Rha | H01L 21/76829 |
| 2017/0278796 | A1* | 9/2017 | Briggs | H01L 21/76897 |
| 2020/0258772 | A1* | 8/2020 | Hsieh | H01L 21/76832 |
| 2020/0411427 | A1* | 12/2020 | Lin | H01L 23/5222 |
| 2021/0043498 | A1 | 2/2021 | Lai | |

OTHER PUBLICATIONS

Raphael et al. "Surface Modification and Grafting of Carbon Fibers: A Route to Better Interface." Progress in Crystal Growth and Characterization of Materials 64 (2018) 75-101, published Jul. 25, 2018.
U.S. Appl. No. 16/898,705, filed Jun. 11, 2020.
U.S. Appl. No. 17/355,613, filed Jun. 23, 2021.
U.S. Appl. No. 17/236,234, filed Apr. 21, 2021.
Notice of Allowance dated Dec. 9, 2021 in connection with U.S. Appl. No. 16/898,705.
Non-Final Office Action dated Aug. 27, 2021 in connection with U.S. Appl. No. 16/898,705.

* cited by examiner

METHOD OF FORMING AN INTEGRATED CHIP HAVING A CAVITY BETWEEN METAL FEATURES

BACKGROUND

Many modern day integrated chips contain millions of semiconductor devices, such as active semiconductor devices (e.g., transistors) and/or passive semiconductor devices (e.g., resistors, diodes, capacitors). The semiconductor devices are electrically interconnected by way of back-end-of-the-line (BEOL) metal interconnect layers that are formed along interlayer dielectric (ILD) layers and above the semiconductor devices on an integrated chip. A typical integrated chip comprises a plurality of dielectric layers and a plurality of back-end-of-the-line metal interconnect layers including different sized metal wires vertically coupled together with metal contacts (i.e., vias).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
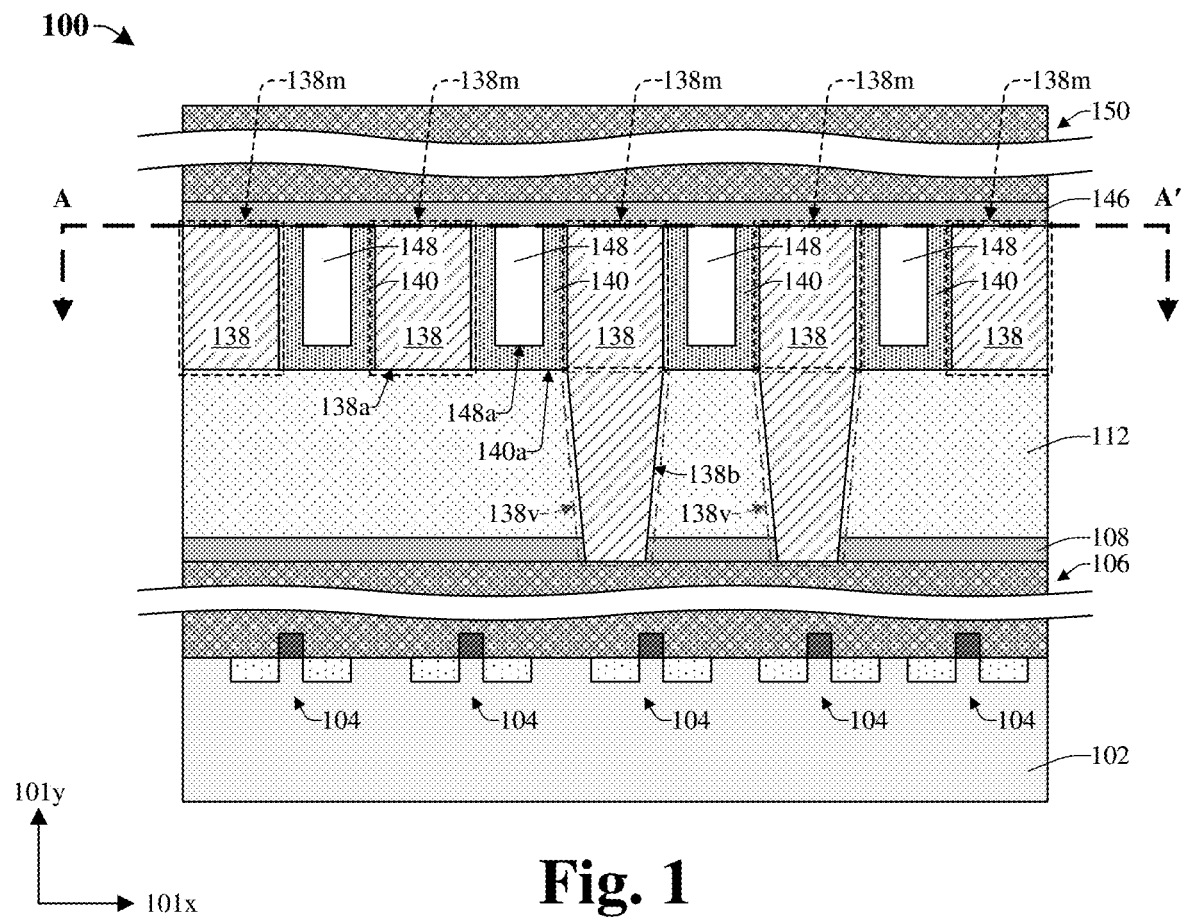
FIG. 1 illustrates a cross-sectional view of some embodiments of an integrated chip comprising a first cavity between a first metal feature and a second metal feature.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes a plurality of metal lines over a substrate that are laterally separated from one another by an interlayer dielectric (ILD) layer. The ILD layer comprises a dielectric material and is intended to electrically isolate the plurality of metal lines from one another. However, a capacitance exists between the plurality of metal lines that is dependent on the dielectric constant of the ILD layer that is between the plurality of metal lines. The capacitance between the plurality of metal lines contributes to a resistive-capacitive (RC) delay which affects a switching speed of the integrated chip. Further, the dielectric constant of the ILD layer may be higher than desired and thus may contribute to an undesirable RC delay of the integrated chip. As a result, an overall performance of the integrated chip may be less than desirable.

Various embodiments of the present disclosure are related to an integrated chip comprising a first cavity between a first metal feature and a second metal feature for reducing a capacitance between the first metal feature and the second metal feature. The first metal feature is over a substrate. The second metal feature is over the substrate and laterally adjacent to the first metal feature. A first dielectric liner segment is laterally between the first metal feature and the second metal feature. The first dielectric liner segment is disposed on a sidewall of the first metal feature that faces the second metal feature and disposed on a sidewall of the second metal feature that faces the first metal feature. Further, the first cavity is laterally between the first metal feature and the second metal feature. The first cavity is defined, at least in part, by sidewalls and an upper surface of the first dielectric liner segment. The first cavity may, for example, comprise air or some other suitable substance that comprises a relatively low dielectric constant.

By including the first cavity laterally between the first metal feature and the second metal feature, a net dielectric constant between the first metal feature and the second metal feature may be reduced. Thus, a capacitance between the first metal feature and the second metal feature may also be reduced. As a result, an RC delay of the integrated chip may be reduced, thereby improving a performance of the integrated chip.

FIG. 1 illustrates a cross-sectional view of some embodiments of an integrated chip 100 comprising a first cavity 148a between a first metal feature 138a and a second metal feature 138b.

In such embodiments, the integrated chip 100 includes a substrate 102 and a plurality of semiconductor devices 104 in and/or on the substrate 102. A first interconnect structure 106 may be disposed over the substrate 102 and may, for example, comprise one or more metal lines, one or more metal vias, one or more contacts, one or more dielectric layers, or the like. A first etch-stop layer 108 is over the first interconnect structure 106 and an interlayer dielectric (ILD) layer 112 is over the first etch-stop layer 108.

In addition, a plurality of metal features 138 are over the ILD layer 112. The plurality of metal features 138 are laterally separated by a plurality of dielectric liner segments 140 and by a plurality of cavities 148. Any of the plurality of metal features 138 may, for example, be or comprise any of a metal line (e.g., 138m), a metal via (e.g., 138v), some other metal feature, or the like.

For example, a first metal feature 138a is over the ILD layer 112 and laterally adjacent to a second metal feature 138b. The first metal feature 138a may, for example, be a metal line 138m and the second metal feature 138b may, for example, comprise a metal line 138m and a metal via 138v. In addition, a first dielectric liner segment 140a extends laterally between the first metal feature 138a and the second metal feature 138b. The first dielectric liner segment 140a extends continuously from a sidewall of the first metal feature 138a that faces the second metal feature 138b, to along a top surface of the ILD layer 112, and further to a sidewall of the second metal feature 138b that faces the first metal feature 138a. Further, a first cavity 148a is also laterally between the first metal feature 138a and the second metal feature 138b. The first cavity 148a is defined, at least in part, by sidewalls and an upper surface of the first dielectric liner segment 140a.

In some embodiments, the upper surface of the first dielectric liner segment 140a that defines the first cavity 148a is above a bottom surface of the first metal feature 138a and above a bottom surface of the second metal feature 138b. Thus, a bottom of the first cavity 148a is above a bottom surface of the first metal feature 138a and above a bottom surface of the second metal feature 138b.

In some embodiments, the second metal feature 138b extends through the ILD layer 112 and through the first etch-stop layer 108 to the first interconnect structure 106. For example, the second metal feature 138b may be electrically connected to one or more of the plurality of semiconductor devices 104 by way of the first interconnect structure 106.

A second etch-stop layer 146 extends over top surfaces of the plurality of metal features 138, over top surfaces of the plurality of cavities 148, and over top surfaces of the plurality of dielectric liner segments 140. One or more bottom surfaces of the second etch-stop layer 146 define tops of the plurality of cavities 148. For example, a bottom surface of the second etch-stop layer 146 further defines the first cavity 148a.

In some embodiments, any of the plurality of cavities 148 may, for example, comprise air, nitrogen, oxygen, some other suitable substance that comprises a relatively low dielectric constant, or the like.

By including the first cavity 148a laterally between the first metal feature 138a and the second metal feature 138b, a net dielectric constant between the first metal feature 138a and the second metal feature 138b may be reduced, thereby reducing a capacitance between the first metal feature 138a and the second metal feature 138b. As a result, an RC delay of the integrated chip 100 may be reduced, thereby improving a performance of the integrated chip 100.

In some embodiments, a second interconnect structure 150 may be over the second etch-stop layer 146 and may, for example, comprise one or more metal lines, one or more metal vias, one or more solder bumps, one or more dielectric layers, or the like.

The substrate 102 may, for example, comprise silicon, some other semiconductor, or the like. The plurality of semiconductor devices 104 may, for example, be any of a metal-oxide-semiconductor field-effect transistor (MOS-FET), a bipolar junction transistor (BJT), a junction field-effect transistor (JFET), an insulated gate bipolar transistor (IGBT), or the like.

Any of the first etch-stop layer 108 and the second etch-stop layer 146 may, for example, comprise silicon carbide, silicon oxide, silicon oxycarbide, silicon nitride, silicon carbonitride, silicon oxynitride, silicon oxycarbonitride, aluminum oxynitride, aluminum oxide, aluminum nitride, or the like and may have a thickness along a y-axis 101y of about 10 to 1000 angstroms or some other suitable thickness.

Any of the ILD layer 112 and the plurality of dielectric liner segments 140 may, for example, comprise silicon carbide, silicon oxide, silicon oxycarbide, silicon nitride, silicon carbonitride, silicon oxynitride, silicon oxycarbonitride, or the like, and may have a thickness along the y-axis 101y of about 30 to 800 angstroms or some other suitable thickness. In some embodiments, the ILD layer 112 and the plurality of dielectric liner segments 140 may comprise different materials.

The plurality of metal features 138 may, for example, comprise tantalum, tantalum nitride, titanium nitride, copper, cobalt, ruthenium, molybdenum, iridium, tungsten, or the like and may have a thickness along the y-axis 101y of about 10 to 1000 angstroms or some other suitable thickness.

In addition, widths of the plurality of metal features 138 as measured along an x-axis 101x may be about 5 to 3000 nanometers. Further, a width of the second metal feature 138b along a bottom surface of the second metal feature 138b that extends along the x-axis 101x may, for example, be about 5 to 300 nm. In some embodiments, angles between bottom surfaces of the plurality of metal features 138 and sidewalls of the plurality of metal features 138 may be about 50 to 95 degrees. Further, an angle between a bottom surface of the second metal feature 138b and a sidewall of the second metal feature 138b may, for example, be about 40 to 90 degrees.

Although the first interconnect structure 106 is illustrated below the metal features 138, in some other embodiments, the first interconnect structure 106 may be omitted from the integrated chip 100. Thus, any of the plurality of metal features 138 may be directly connected to any of the plurality of semiconductor devices 104.

Figure 2:
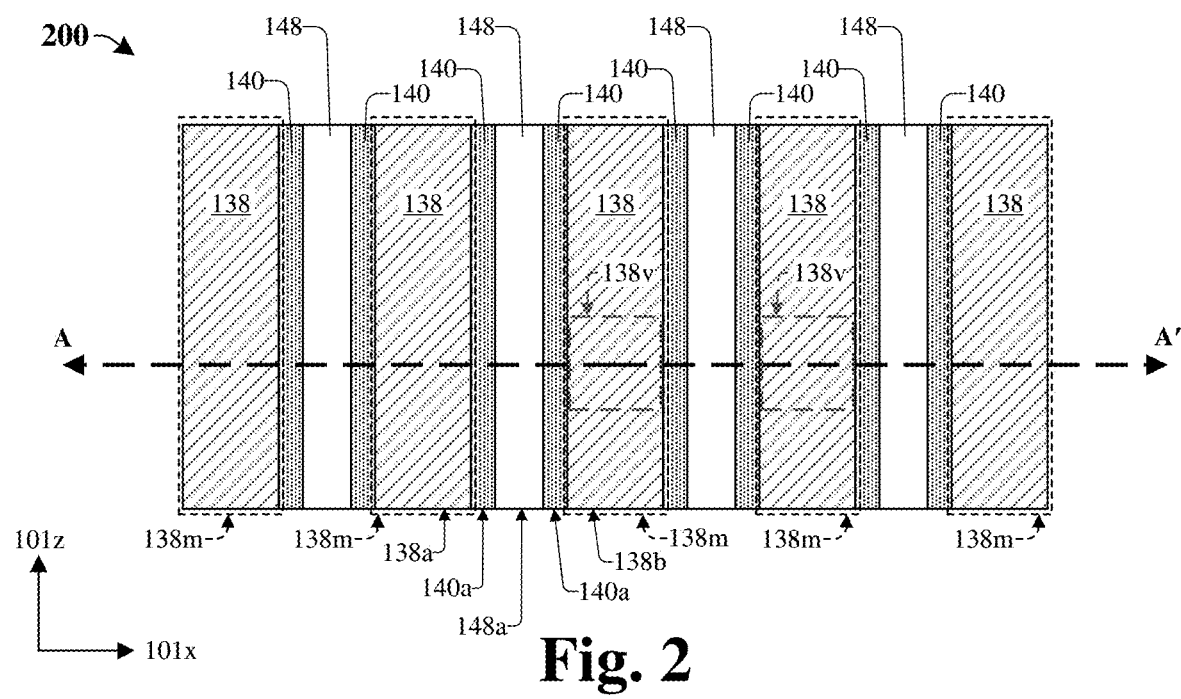
FIG. 2 illustrates a top layout view of some embodiments of an integrated chip comprising a first cavity between a first metal feature and a second metal feature.

FIG. 2 illustrates a top layout view of some embodiments of an integrated chip 200 comprising a first cavity 148a between a first metal feature 138a and a second metal feature 138b.

In such embodiments, top surfaces of the first metal feature 138a and the second metal feature 138b have lengths that extend along a z-axis 101z. Further, a first dielectric liner segment 140a that defines, in part, the first cavity 148a also has length that extends along the z-axis. The first dielectric liner segment 140a and the first cavity 148a extend along the z-axis between the first metal feature 138a and the second metal feature 138b.

Figure 3:
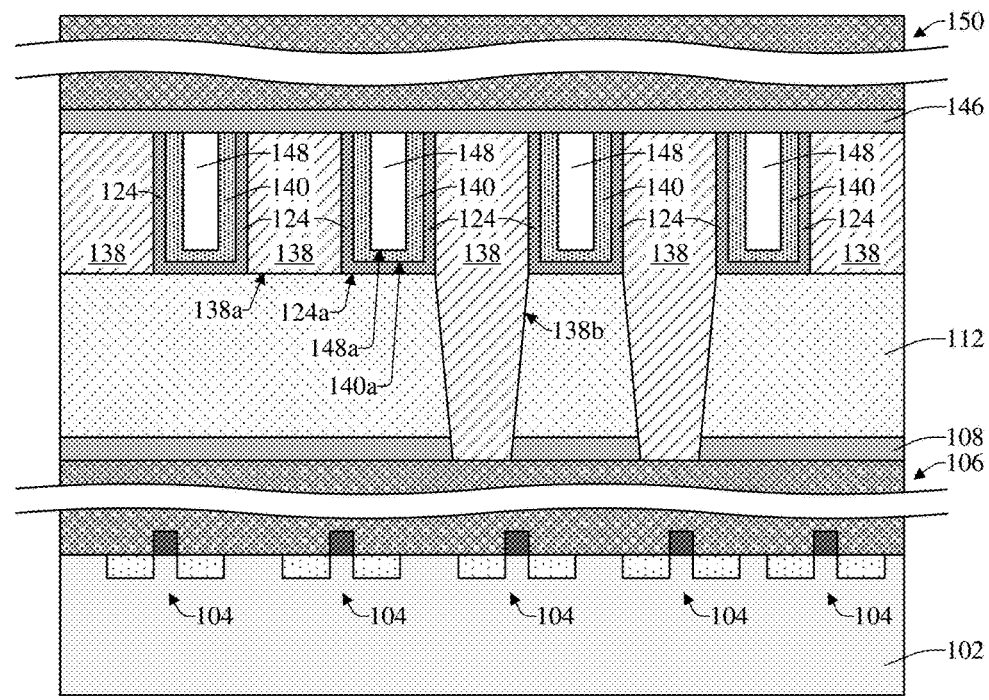
FIG. 3 illustrates a cross-sectional view of some embodiments of an integrated chip comprising a first sacrificial segment on a sidewall of a first metal feature.

FIG. 3 illustrates a cross-sectional view of some embodiments of an integrated chip 300 comprising a first sacrificial segment 124a on a sidewall of a first metal feature 138a.

In such embodiments, a plurality of first sacrificial segments 124 may be on sidewalls of any of the plurality of metal features 138 between the plurality of metal features 138 and the plurality of dielectric liner segments 140. For example, a first sacrificial segment 124a may be on the sidewall of the first metal feature 138a between the first metal feature 138a and a first dielectric liner segment 140a due to the first sacrificial segment 124a not being entirely removed from the sidewall of the first metal feature 138a during a first sacrificial segment removal process (see, for example, FIGS. 14 and 15). In some embodiments, the first sacrificial segment 124a may also be disposed on a sidewall of the second metal feature 138b and an upper surface of an ILD layer 112.

The plurality of first sacrificial segments 124 may, for example, comprise any of titanium nitride, titanium oxide, tungsten doped carbon, hafnium oxide, zirconium oxide, zinc oxide, titanium zirconium oxide, silicon carbide, silicon dioxide, silicon oxycarbide, silicon nitride, silicon carbonitride, silicon oxynitride, silicon oxycarbonitride, aluminum oxide, aluminum oxynitride, or the like.

Figure 4:
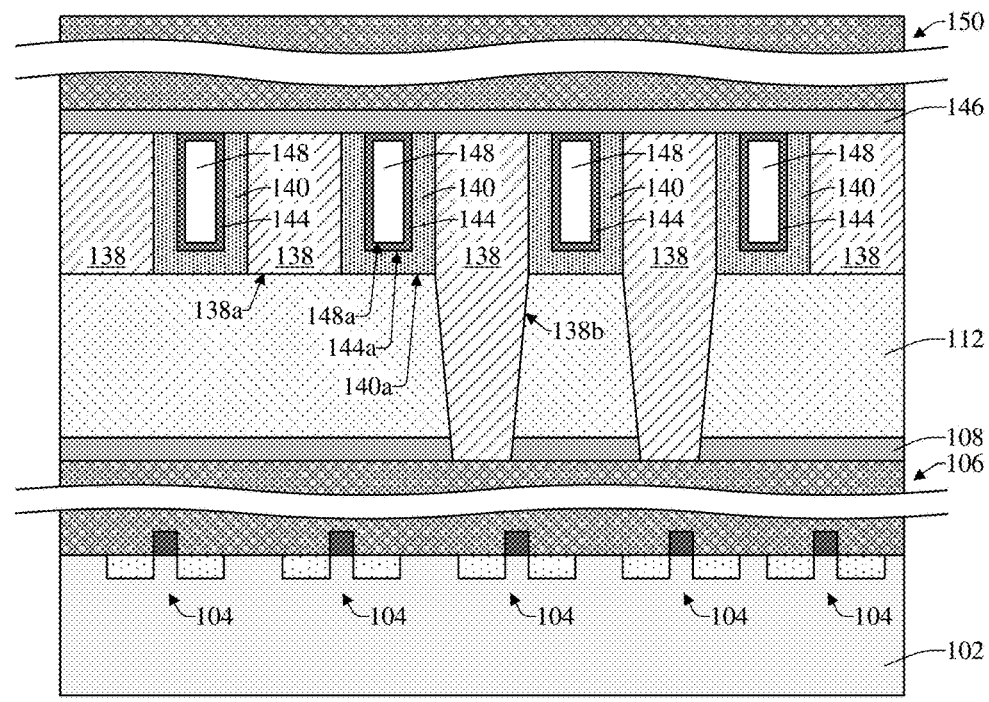
FIG. 4 illustrates a cross-sectional view of some embodiments of an integrated chip comprising a second sacrificial segment on a dielectric liner.

FIG. 4 illustrates a cross-sectional view of some embodiments of an integrated chip 400 comprising a second sacrificial segment 144a on a first dielectric liner segment 140a.

In such embodiments, a plurality of second sacrificial segments 144 may be on any of sidewalls of a plurality of dielectric liner segments 140, upper surfaces of the plurality of dielectric liner segments 140, and one or more lower surfaces of a second etch-stop layer 146. For example, a second sacrificial segment 144a may be on any of sidewalls of a first dielectric liner segment 140a, an upper surface of the first dielectric liner segment 140a, and a lower surface of the second etch-stop layer 146 due to the second sacrificial segment 144a not being entirely removed during a second sacrificial segment removal process (see, for example, FIGS. 18 and 19).

The plurality of second sacrificial segments 144 may, for example, comprise any of titanium nitride, titanium oxide, tungsten doped carbon, hafnium oxide, zirconium oxide, zinc oxide, titanium zirconium oxide, silicon carbide, silicon dioxide, silicon oxycarbide, silicon nitride, silicon carbonitride, silicon oxynitride, silicon oxycarbonitride, aluminum oxide, aluminum oxynitride, or the like. In some embodiments, the plurality of second sacrificial segments 144 and the plurality of first sacrificial segments (e.g., 124 of FIG. 3) comprise different materials.

FIGS. 5-20 illustrate cross-sectional views 500-2000 of some embodiments of an integrated chip comprising a first cavity 148a between a first metal feature 138a and a second metal feature 138b. Although FIGS. 5-20 are described in relation to a method, it will be appreciated that the structures disclosed in FIGS. 5-20 are not limited to such a method, but instead may stand alone as structures independent of the method.

Figure 5:
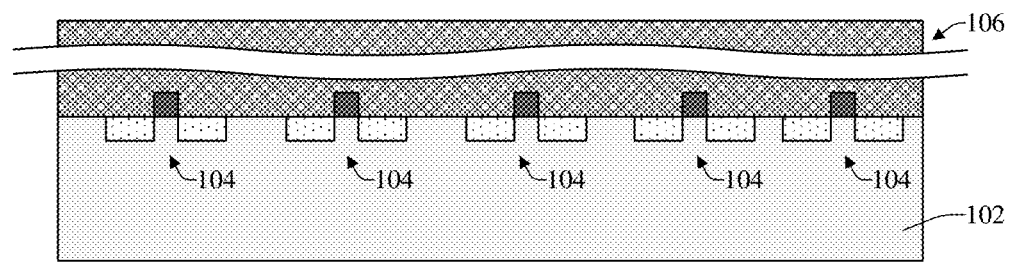
FIGS. 5-20 illustrate cross-sectional views of some embodiments of a method for forming an integrated chip comprising a first cavity between a first metal feature and a second metal feature.

As shown in cross-sectional view 500 of FIG. 5, a plurality of semiconductor devices 104 are formed in a substrate 102. For example, a plurality of source/drain regions may be formed in the substrate 102 by way of an ion implantation process or the like. Further, a plurality of gate structures or the like may, for example, be formed over the substrate 102 and between the plurality of source/drain regions by way of one or more deposition processes and one or more patterning processes.

In addition, a first interconnect structure 106 may be formed over the substrate 102 and may, for example, comprise one or more metal lines, one or more metal vias, one or more contacts, one or more dielectric layers, or the like. Forming the first interconnect structure 106 may, for example, comprise depositing one or more dielectric layers over the substrate 102, patterning the one or more dielectric layers to form one or more openings in the one or more dielectric layers, and depositing one or more metals in the one or more openings. Any of the one or more metal lines, one or more metal vias, one or more contacts, or the like may be electrically connected to any of the plurality of semiconductor devices 104.

Figure 6:
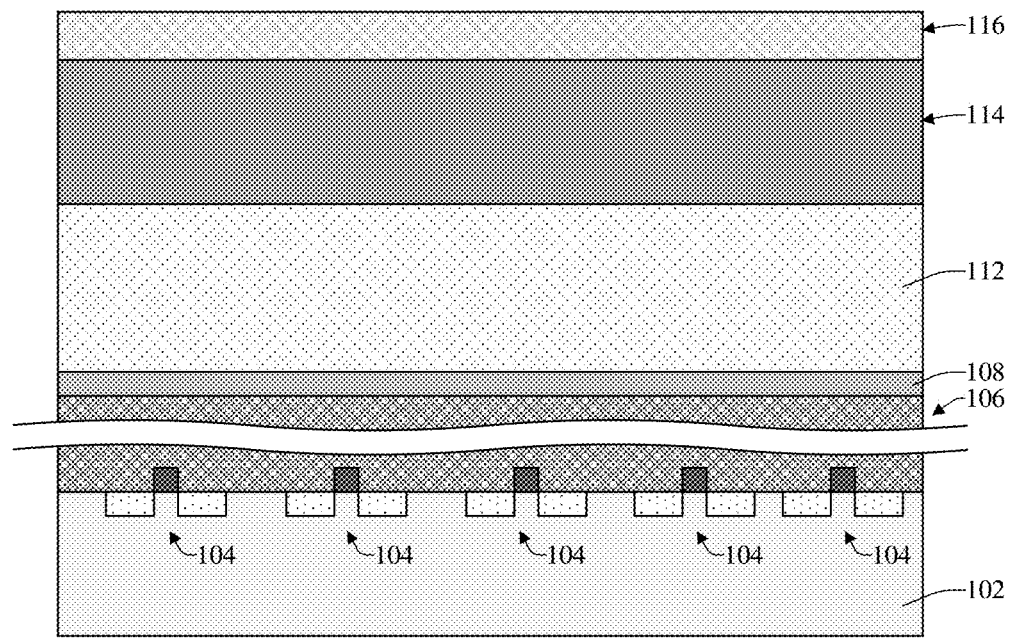

As shown in cross-sectional view 600 of FIG. 6, a first etch-stop layer 108 is formed over the substrate 102. The first etch-stop layer 108 may, for example, be formed by depositing any of silicon carbide, silicon oxide, silicon oxycarbide, silicon nitride, silicon carbonitride, silicon oxynitride, silicon oxycarbonitride, aluminum oxynitride, aluminum oxide, aluminum nitride, or the like over the substrate 102 by a physical vapor deposition (PVD) process, a chemical vapor deposition (CVD) process, an atomic layer deposition (ALD) process, a spin on process, or the like. A temperature of the first etch-stop layer 108 during the deposition may, for example, be about 20 to 400 degrees Celsius or some other suitable temperature. Further, a thickness of the first etch-stop layer 108 may be about 10 to 1000 angstroms.

An ILD layer 112 is formed over the first etch-stop layer 108. The ILD layer is formed by depositing any of silicon carbide, silicon oxide, silicon oxycarbide, silicon nitride, silicon carbonitride, silicon oxynitride, silicon oxycarbonitride, or the like over the first etch-stop layer 108 by a PVD process, a CVD process, an ALD process, a spin on process, or the like. A temperature of the ILD layer during the deposition may, for example, be about 50 to 400 degrees Celsius or some other suitable temperature. Further, a thickness of the ILD layer 112 may, for example, be about 30 to 800 angstroms.

A first sacrificial layer 114 is formed over the ILD layer 112. The first sacrificial layer 114 may be formed by depositing any of titanium nitride, titanium oxide, tungsten doped carbon, hafnium oxide, zirconium oxide, zinc oxide, titanium zirconium oxide, silicon carbide, silicon dioxide, silicon oxycarbide, silicon nitride, silicon carbonitride, silicon oxynitride, silicon oxycarbonitride, aluminum oxide, aluminum oxynitride, or the like over the ILD layer 112 by a CVD process, a PVD process, an ALD process, or the like. A temperature of the first sacrificial layer 114 during the deposition may, for example, be about 50 to 400 degrees Celsius or some other suitable temperature. Further, a thickness of the first sacrificial layer 114 may be about 30 to 600 angstroms or some other suitable thickness.

A hard mask layer 116 is formed over the first sacrificial layer 114. The hard mask layer 116 may be formed by depositing any of titanium nitride, titanium oxide, tungsten doped carbon, hafnium oxide, zirconium oxide, zinc oxide, titanium zirconium oxide, silicon carbide, silicon dioxide, silicon oxycarbide, silicon nitride, silicon carbonitride, silicon oxynitride, silicon oxycarbonitride, aluminum oxide, aluminum oxynitride, or the like over the first sacrificial layer 114 by a CVD process, a PVD process, an ALD process, or the like. A temperature of the hard mask layer 116 during the deposition may, for example, be about 50 to 400 degrees Celsius or some other suitable temperature. Further, a thickness of the hard mask layer 116 may, for example, be about 30 to 500 angstroms or some other suitable thickness.

Figure 7:
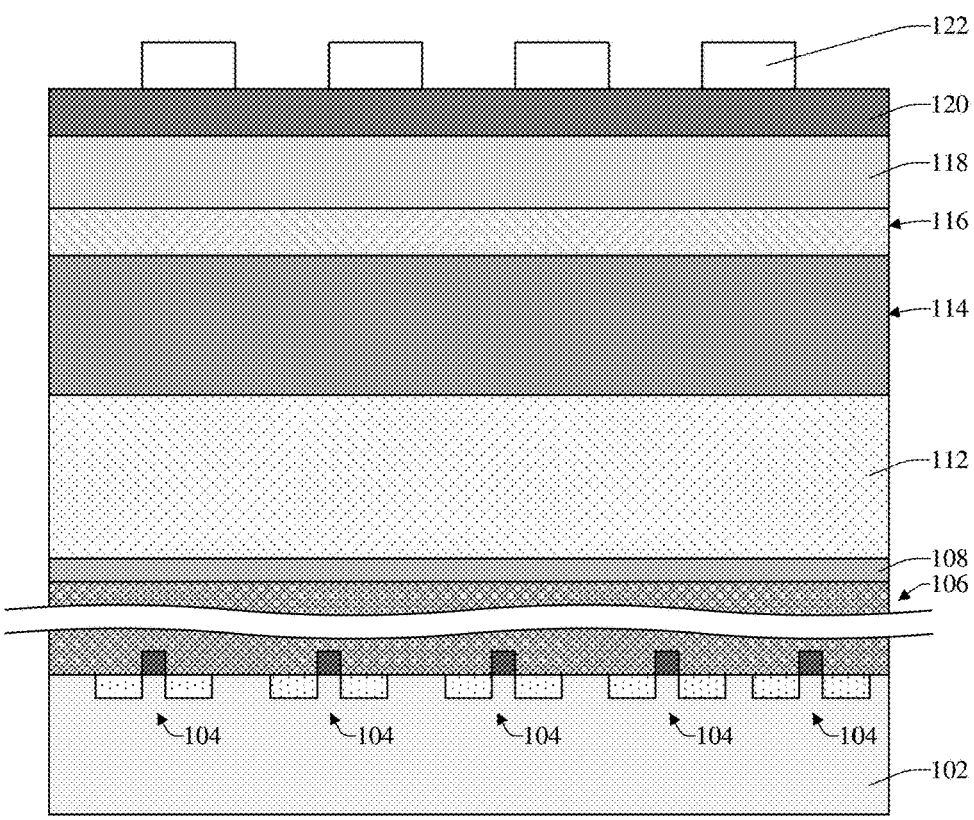

As shown in cross-sectional view 700 of FIG. 7, a bottom lithography layer 118 is formed over the hard mask layer 116, a middle lithography layer 120 is formed over the bottom lithography layer 118, and a photoresist mask 122 is formed over the middle lithography layer 120. Any of the bottom lithography layer 118 and the middle lithography layer 120 may comprise an organic polymer, an inorganic polymer, or the like and may be formed by a CVD process, a PVD process, an ALD process, a spin on process, or the like.

Figure 8:
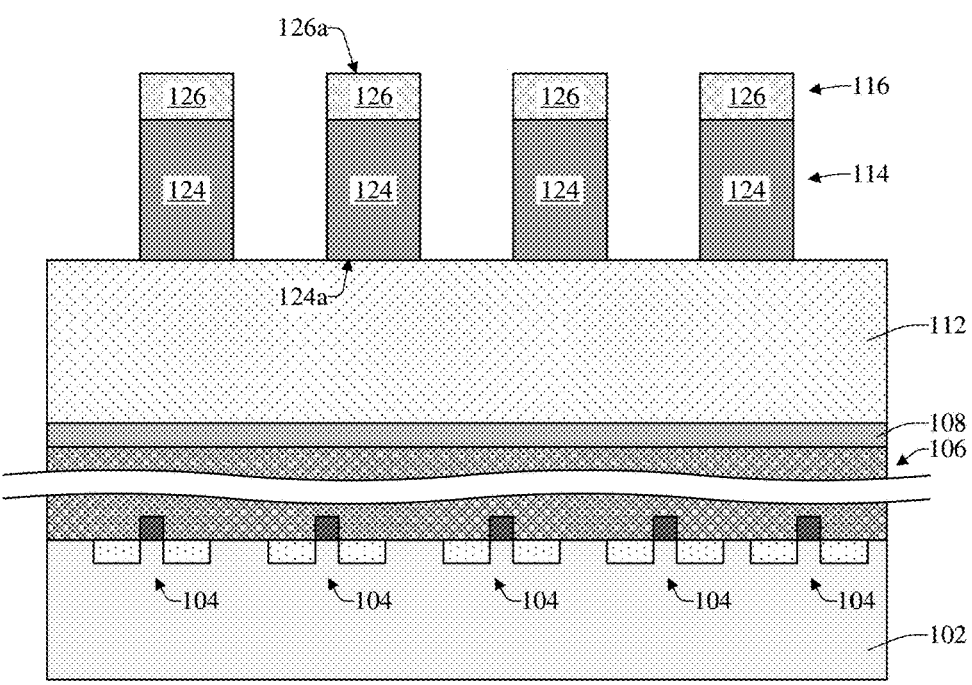

As shown in cross-sectional view 800 of FIG. 8, the hard mask layer 116 and the first sacrificial layer 114 are patterned with any of the bottom lithography layer 118, the middle lithography layer 120, and the photoresist mask 122 in place to define a plurality of first sacrificial segments 124 and to define a plurality of hard mask segments 126 on top surfaces of the plurality of first sacrificial segments 124. As a result, the plurality of first sacrificial segments 124 are laterally spaced apart over the ILD layer 112. For example, the patterning may define a first sacrificial segment 124a and a first hard mask segment 126a on a top surface of the first sacrificial segment 124a. The patterning may, for example, comprise any of a lithography process, a wet etching process, a dry etching process, or the like.

For example, a wet etching process may utilize any of hydrofluoric acid, potassium hydroxide, tetramethylammonium hydroxide, phosphoric acid, acetic acid, nitric acid, hydrochloric acid, hydrogen peroxide, or the like. In addition, a dry etching process may, for example, comprise a reactive-ion etching (RIE) process that may utilize inductively coupled plasma (ICP), capacitively couple plasma (CCP), or the like. Further, the dry etching process may utilize a power of about 50 to 3000 watts, a voltage bias of about 0 to 1200 volts, a temperature of about 0 to 100 degrees Celsius, and a pressure of about 0.2 to 120 millitorr. Furthermore, the dry etching process may utilize any of methane, fluoromethane, difluoromethane, trifluoromethane, octafluorocyclobutane, hexafluoro-1,3-butadiene, tetrafluoromethane, hydrogen, hydrogen bromide, carbon monoxide, carbon dioxide, oxygen, boron trichloride, chlorine, nitrogen, helium, neon, argon, some other gas, or the like.

Figure 9:
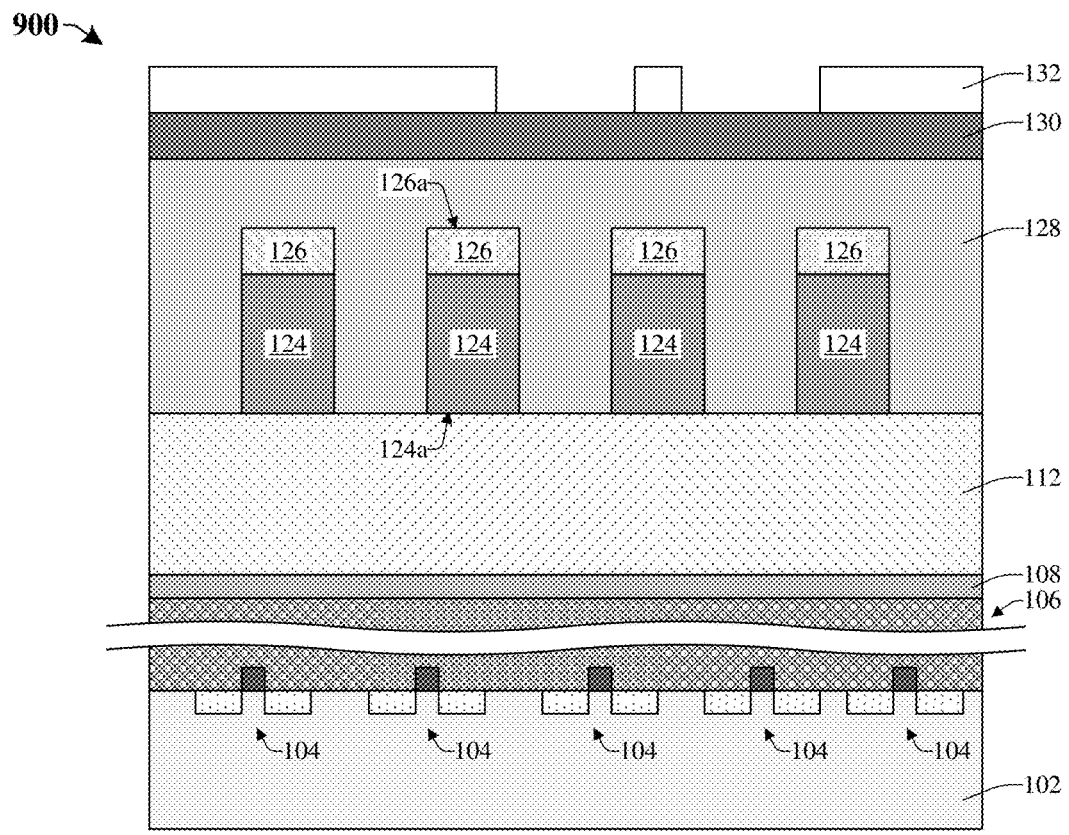

As shown in cross-sectional view 900 of FIG. 9, a bottom lithography layer 128 is formed over the ILD layer 112, over and between the plurality of first sacrificial segments 124, and over and between the plurality of hard mask segments 126. For example, the bottom lithography layer 128 is formed along sidewalls of the first sacrificial segment 124a and on a top surface of the hard mask segment 126. In addition, a middle lithography layer 130 is formed over the bottom lithography layer 128 and a photoresist mask 132 is formed over the middle lithography layer 130.

Figure 10:
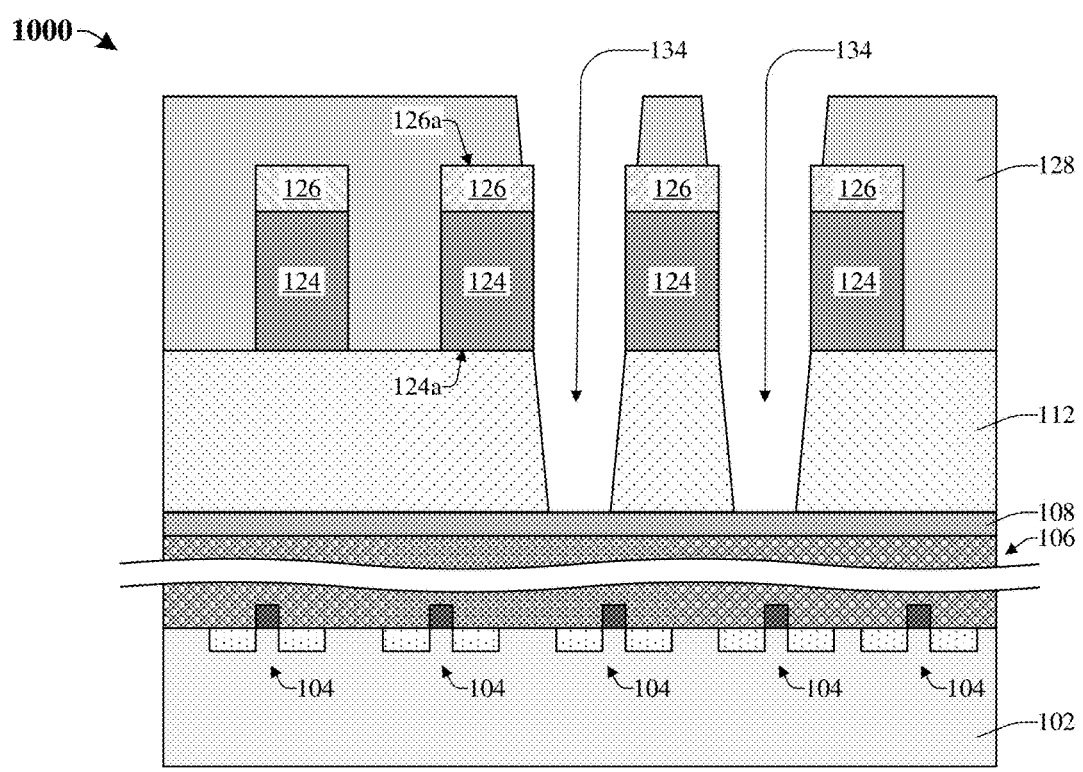

As shown in cross-sectional view 1000 of FIG. 10, the ILD layer 112 is patterned with any of the bottom lithography layer 128, the middle lithography layer 130, and the photoresist mask 132 in place to form one or more first openings 134 in the ILD layer 112. The one or more first openings 134 are defined by sidewalls of the ILD layer 112. Further, the bottom lithography layer 128 may remain over the substrate 102 after the patterning.

The patterning may comprise a wet etching process, a dry etching process, or the like. For example, a dry etching process may comprise a RIE process that may utilize ICP, CCP, or the like. Further, the dry etching process may utilize a power of about 50 to 3000 watts, a voltage bias of about 0 to 1200 volts, a temperature of about 0 to 100 degrees Celsius, and a pressure of about 0.2 to 120 millitorr. Furthermore, the dry etching process may utilize any of methane, fluoromethane, difluoromethane, trifluoromethane, octafluorocyclobutane, hexafluoro-1,3-butadiene, tetrafluoromethane, hydrogen, hydrogen bromide, carbon monoxide, carbon dioxide, oxygen, boron trichloride, chlorine, nitrogen, helium, neon, argon, some other gas, or the like.

Figure 11:
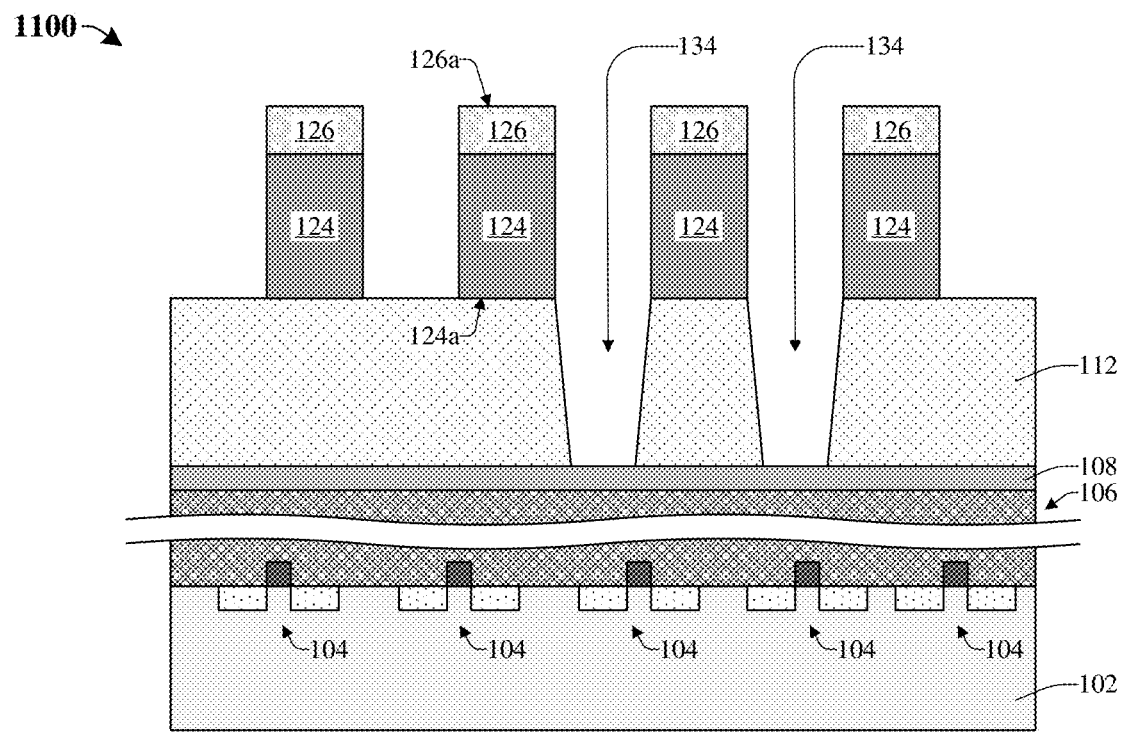

As shown in cross-sectional view 1100 of FIG. 11, the bottom lithography layer 128 is removed. The bottom lithography layer 128 may, for example, be removed with a wet etching process, a dry etching process, or the like.

Figure 12:
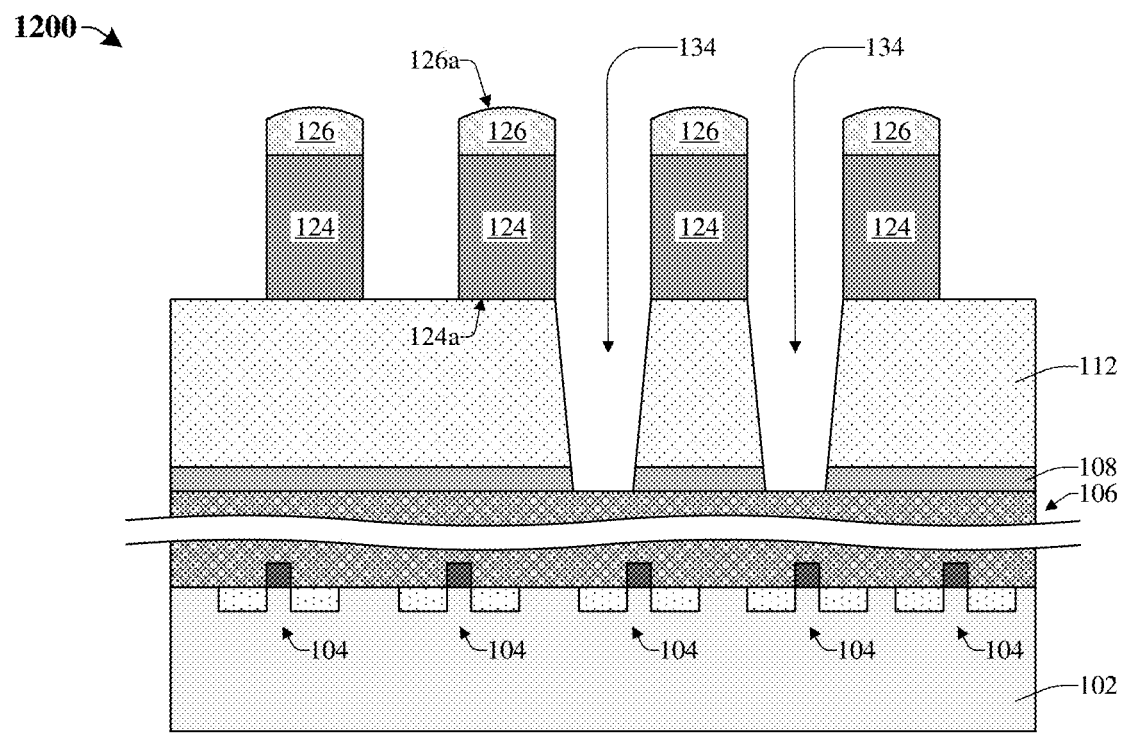

As shown in cross-sectional view 1200 of FIG. 12, the first etch-stop layer 108 is patterned with the plurality of hard mask segments 126 in place to extend the one or more first openings 134 through the first etch-stop layer 108 such that the one or more first openings 134 are further defined by sidewalls of the first etch-stop layer 108. The patterning may also remove one or more portions of the plurality of the hard mask segments 126 and hence the plurality of hard mask segments 126 may, for example, have curved or rounded surfaces.

The patterning may comprise a wet etching process, a dry etching process, or the like. For example, a dry etching process may comprise an ICP dry etching process, a CCP dry etching process, a remote plasma dry etching process, or the like. A power utilized during the dry etching may be about 50 to 3000 watts. A voltage bias utilized during the dry etching may be about 0 to 1200 volts. A temperature during the dry etching may be about 0 to 100 degrees Celsius. A pressure during the dry etching may be about 0.2 to 120 millitorr. Further, the dry etching process may utilize any of methane, fluoromethane, difluoromethane, trifluoromethane, octafluorocyclobutane, hexafluoro-1,3-butadiene, tetrafluoromethane, hydrogen, hydrogen bromide, carbon monoxide, carbon dioxide, oxygen, boron trichloride, chlorine, nitrogen, helium, neon, argon, some other gas, or the like.

Figure 13:
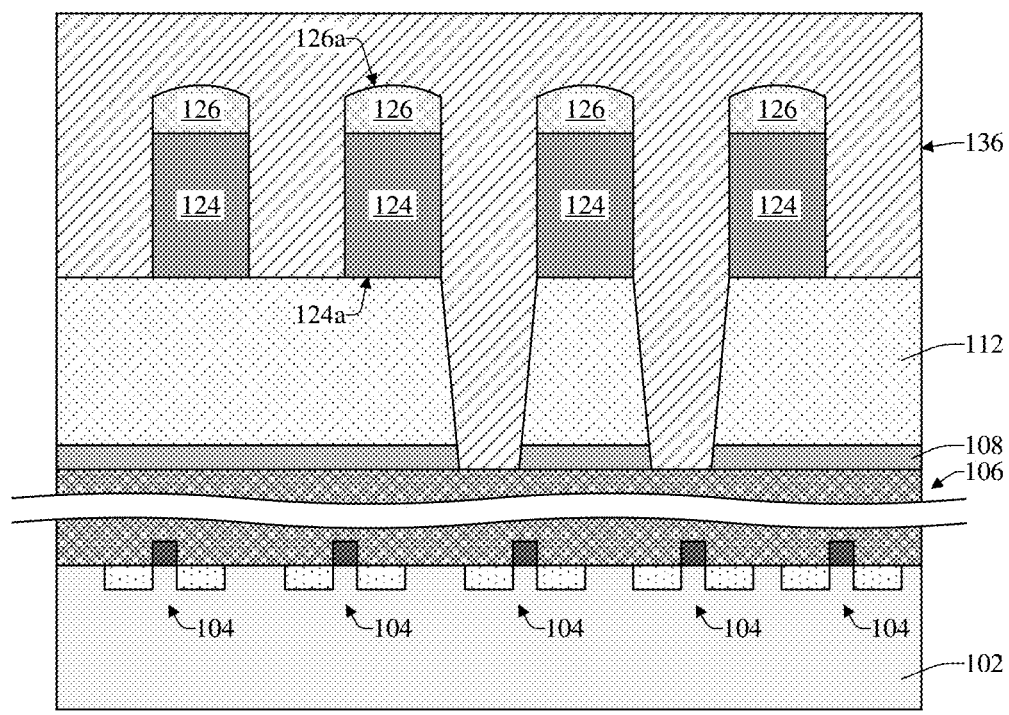

As shown in cross-sectional view 1300 of FIG. 13, a metal material 136 is deposited over the substrate 102 and between the plurality of first sacrificial segments 124. The metal material 136 may fill the one or more first openings 134. The metal material 136 may, for example, comprise tantalum, tantalum nitride, titanium nitride, copper, cobalt, ruthenium, molybdenum, iridium, tungsten, or the like and may be deposited by a PVD process, a CVD process, an ALD process, an electrochemical plating (ECP) process, a sputtering process, or the like. A temperature during the metal deposition may be about 20 to 400 degrees Celsius. Further, a thickness of the metal material 136 may be about 10 to 1000 angstroms.

Figure 14:
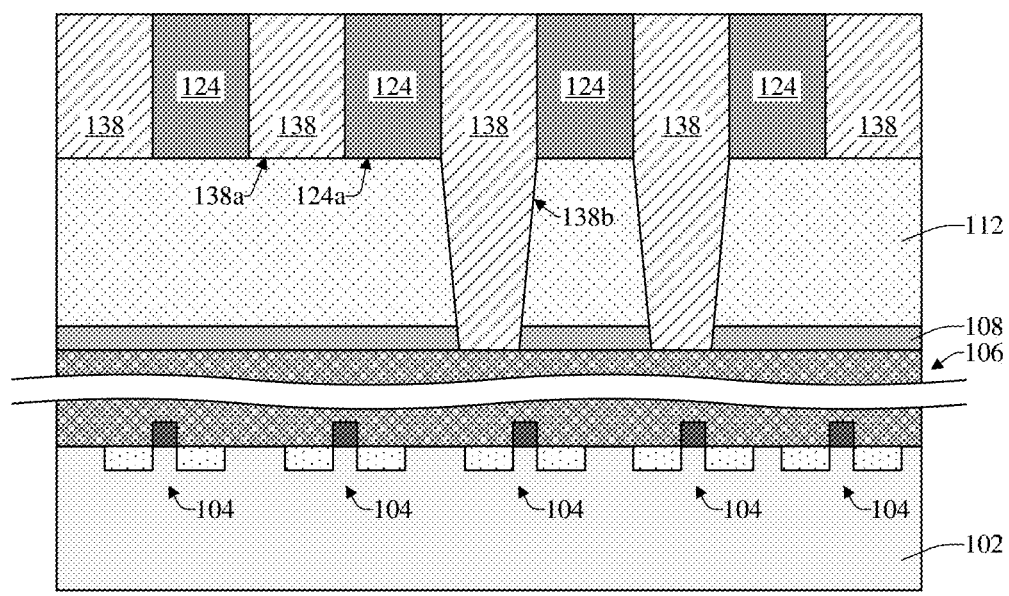

As shown in cross-sectional view 1400 of FIG. 14, a planarization process is performed on the metal material 136 to remove the metal material 136 from over the plurality of first sacrificial segments 124. The planarization process also removes the plurality of hard mask segments 126 from the top surfaces of the plurality of first sacrificial segments 124. Further, the planarization process defines a plurality of metal features 138 between the plurality of first sacrificial segments 124.

For example, the planarization process removes the first hard mask segment 126a from the top surface of the first sacrificial segment 124a and defines a first metal feature 138a and a second metal feature 138b. The first metal feature 138a and the second metal feature 138b may be on opposite sides of the first sacrificial segment 124a.

As a result of the planarization process, top surfaces of the plurality of metal features 138 are approximately planar with the top surfaces of the plurality of first sacrificial segments 124. The planarization process may, for example, comprise a chemical mechanical planarization process (CMP) or the like.

By minimizing the patterning of the ILD layer 112 prior to forming the plurality of metal features 138, the plurality of metal features 138 may be less likely to experience undesirable bending.

Figure 15:
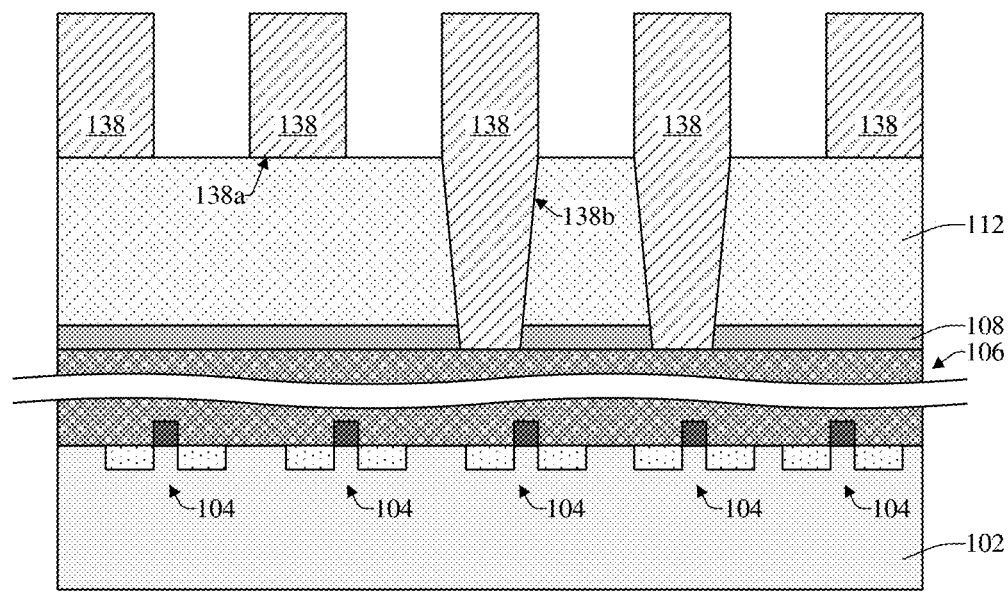

As shown in cross-sectional view 1500 of FIG. 15, a first removal process is performed to remove, at least in part, the plurality of first sacrificial segments 124 from between the plurality of metal features 138.

The first removal process may comprise a wet etching process, a dry etching process, or some other suitable process. For example, a wet etching process may utilize any of hydrofluoric acid, potassium hydroxide, tetramethylammonium hydroxide, phosphoric acid, acetic acid, nitric acid, hydrochloric acid, hydrogen peroxide, or the like. Further, a dry etching process may, for example, comprise an ICP dry etching process, a CCP dry etching process, an ion beam etching (IBE) dry etching process, a remote plasma dry etching process, or the like. A power utilized during the dry etching process may be about 50 to 3000 watts. A voltage bias utilized during the dry etching may be about 0 to 1200 volts. A temperature during the dry etching may be about 0 to 100 degrees Celsius. A pressure during the dry etching may be about 0.2 to 120 millitorr. Further, the dry etching process may utilize any of methane, fluoromethane, difluoromethane, trifluoromethane, octafluorocyclobutane, hexafluoro-1,3-butadiene, tetrafluoromethane, hydrogen, hydrogen bromide, carbon monoxide, carbon dioxide, oxygen, boron trichloride, chlorine, nitrogen, helium, neon, argon, methanol, ethanol, some other gas, or the like.

In some embodiments, the first removal process may not remove the entirety of the plurality of first sacrificial segments 124 from between the plurality of metal features 138. Thus, in such embodiments, one or more portions of the plurality of first sacrificial segments 124 may remain on one or more sidewalls of the plurality of metal features 138 and/or one or more upper surfaces of the ILD layer 112 after the first removal process (see, for example, FIG. 3).

Figure 16:
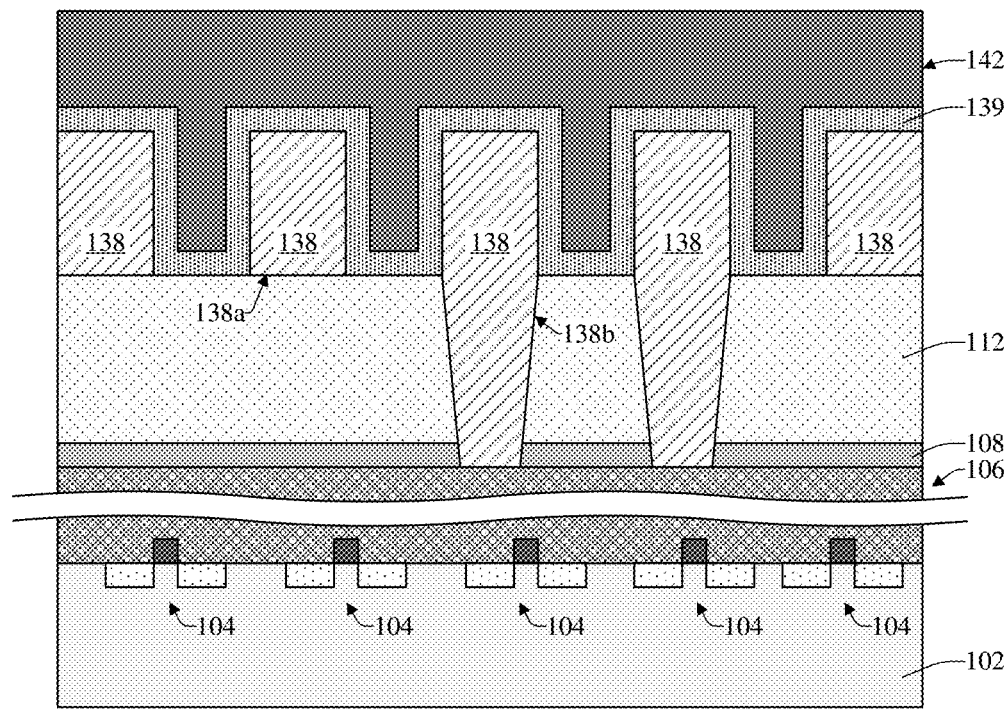

As shown in cross-sectional view 1600 of FIG. 16, a dielectric liner layer 139 is formed on top surfaces of the plurality of metal features 138, on sidewalls of the plurality of metal features 138, and on top surfaces of the ILD layer 112. The dielectric liner layer 139 may, for example, be formed by depositing any of silicon carbide, silicon oxide, silicon oxycarbide, silicon nitride, silicon carbonitride, silicon oxynitride, silicon oxycarbonitride, or the like over the substrate 102 by a CVD process, a PVD process, an ALD process, a spin on process, or the like. A temperature during the deposition may, for example, be about 50 to 400 degrees Celsius. Further, a thickness of the dielectric liner layer 139 may, for example, be about 30 to 800 angstroms.

In addition, a second sacrificial layer 142 is formed over the dielectric liner layer 139 and between sidewalls of the dielectric liner layer 139. The second sacrificial layer 142 may be formed by depositing any of titanium nitride, titanium oxide, tungsten doped carbon, hafnium oxide, zirconium oxide, zinc oxide, titanium zirconium oxide, silicon carbide, silicon dioxide, silicon oxycarbide, silicon nitride, silicon carbonitride, silicon oxynitride, silicon oxycarbonitride, aluminum oxide, aluminum oxynitride, or the like over the substrate 102 by a CVD process, a PVD process, an ALD process, a spin on process, or the like. In some embodiments, the second sacrificial layer 142 is a different material than the first sacrificial layer (e.g., 114 of FIGS. 6-8).

Figure 17:
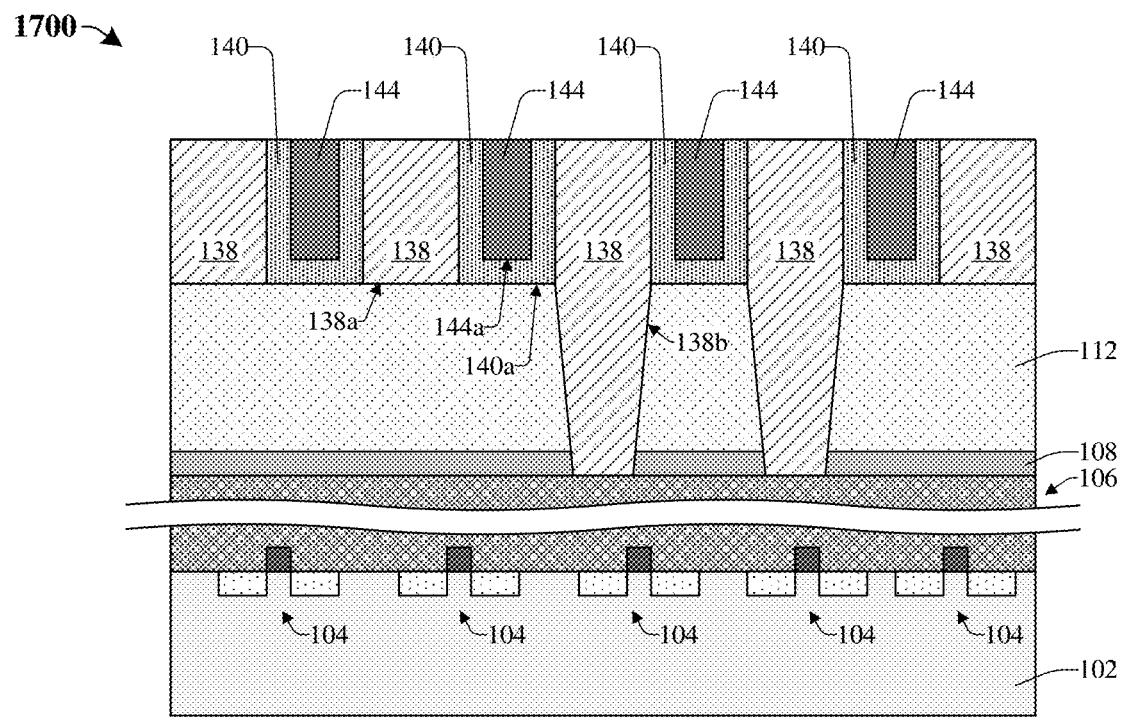

As shown in cross-sectional view 1700 of FIG. 17, a planarization process is performed on the second sacrificial layer 142 to remove the second sacrificial layer 142 from over top surfaces of the plurality of metal features 138. The planarization process also removes portions of the dielectric liner layer 139 from the top surfaces of the plurality of metal features 138. As a result, the planarization process defines a plurality of dielectric liner segments 140 between sidewalls of the plurality of metal features 138 and defines a plurality of second sacrificial segments 144 between sidewalls of the plurality of dielectric liner segments 140. For example, a first dielectric liner segment 140a may be on a sidewall of the first metal feature 138a, on a sidewall of the second metal feature 138b, and between the first metal feature 138a and the second metal feature 138b on an upper surface of the ILD layer 112. Further, a second sacrificial segment 144a may be between sidewalls of the first dielectric liner segment 140a and on an upper surface of the first dielectric liner segment 140a. The planarization process may, for example, comprise a CMP or the like.

Figure 18:
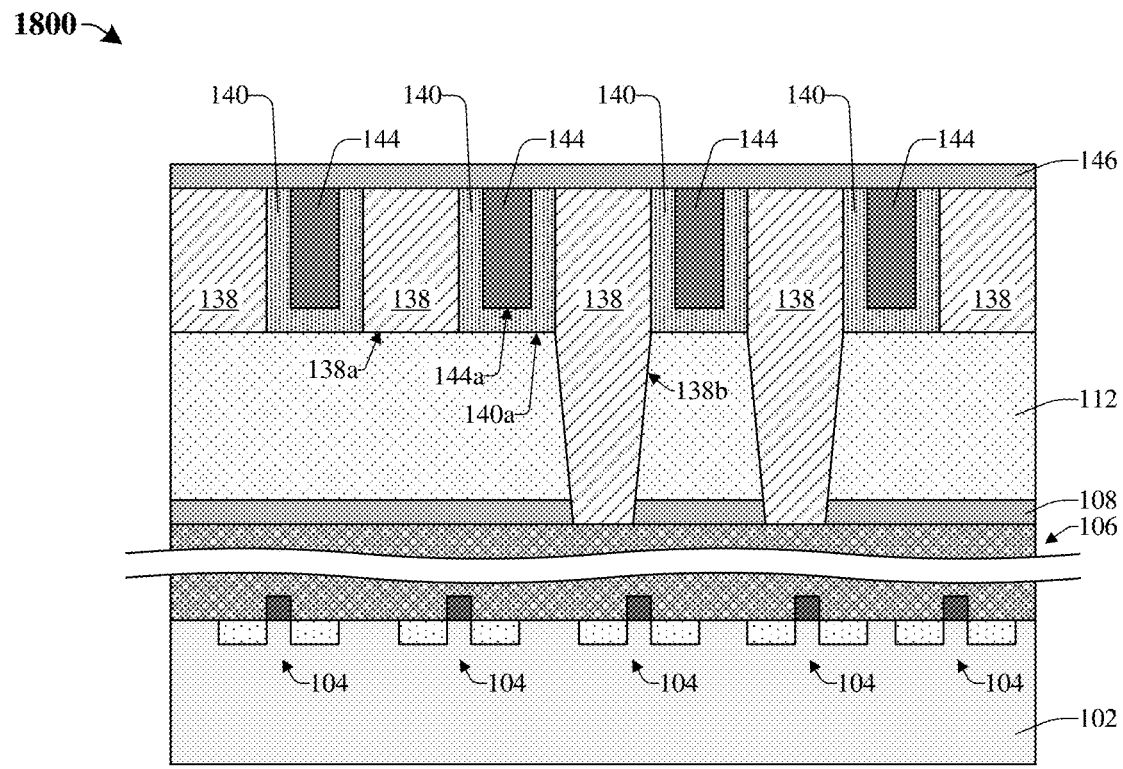

As shown in cross-sectional view 1800 of FIG. 18, a second etch-stop layer 146 is formed on top surfaces of the plurality of metal features 138, on top surfaces of the plurality of dielectric liner segments 140, and on top surfaces of the plurality of second sacrificial segments 144. The second etch-stop layer 146 may be formed by depositing any of silicon carbide, silicon oxide, silicon oxycarbide, silicon nitride, silicon carbonitride, silicon oxynitride, silicon oxycarbonitride, aluminum oxynitride, aluminum oxide, aluminum nitride, or the like over the substrate 102 by a CVD process, a PVD process, an ALD process, a spin on process, or the like. A temperature during the deposition may be about 20 to 400 degrees Celsius. Further, a thickness of the second etch-stop layer 146 may be about 10 to 1000 angstroms.

Figure 19:
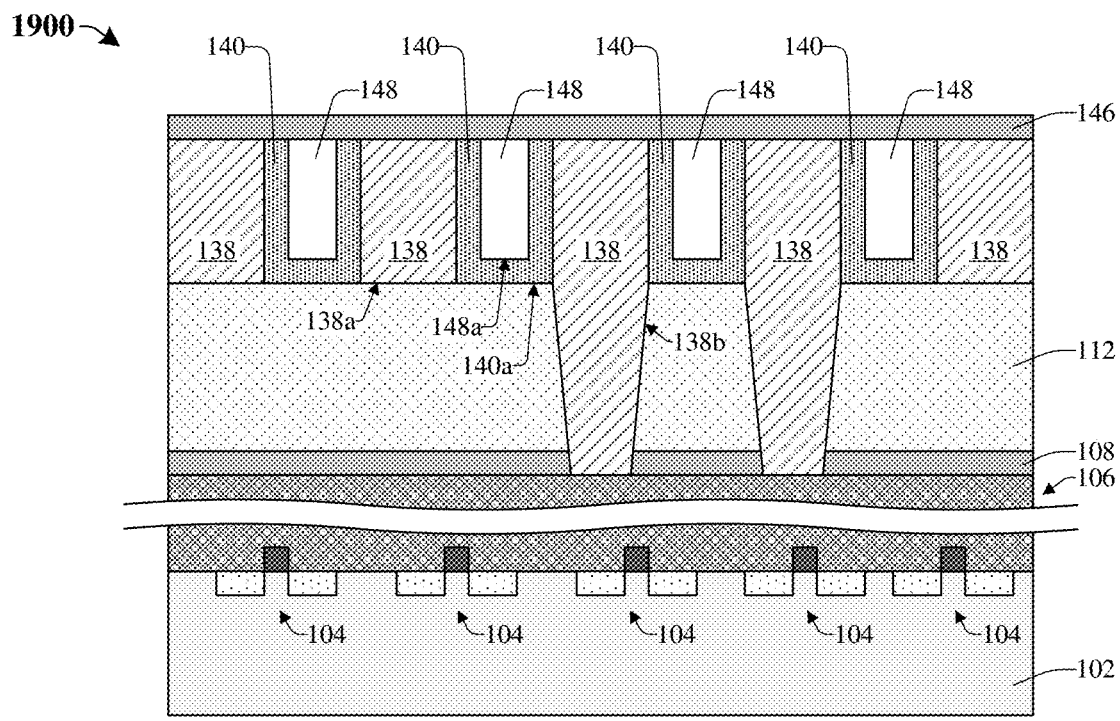

As shown in cross-sectional view 1900 of FIG. 19, a second removal process may be performed to remove, at least in part, the plurality of second sacrificial segments 144 from between the plurality of metal features 138, thereby leaving a plurality of cavities 148 in their place. Thus, the plurality of cavities 148 are defined by sidewalls of the plurality of dielectric liner segments 140, upper surfaces of the plurality of dielectric liner segments 140, and one or more lower surfaces of the second etch-stop layer 146. For example, a first cavity 148a may be defined by sidewalls of the first dielectric liner segment 140a, an upper surface of the first dielectric liner segment 140a, and a lower surface of the second etch-stop layer 146.

The second removal process may, for example, comprise a heating process or the like. For example, a heating process may comprise baking the integrated chip in an oven or some other heating apparatus at about 250 to 400 degrees Celsius for about 30 to 600 seconds or some other suitable time. In some embodiments, the heating process may comprise a thermal decomposition of the plurality of second sacrificial segments 144. Further, the second removal process is performed with the second etch-stop layer 146 in place. For example, the heating process may transform the plurality of second sacrificial segments 144 from the solid phase to the gaseous phase, and the gas may escape the plurality of cavities 148 by passing through (e.g., by diffusion) the second etch-stop layer 146. In some embodiments, the gas may be extracted from the plurality of cavities 148 through the second etch-stop layer 146. In some embodiments (not shown), one or more openings may be formed in the second etch-stop layer 146 to allow the gas to escape the plurality of cavities 148 more easily.

By removing the plurality of second sacrificial segments 144 and forming the plurality of cavities 148 in their place, a control of the size and/or location of the plurality of cavities 148 may be achieved. For example, by controlling the formation of the plurality of second sacrificial segments 144 and subsequently removing the plurality of second sacrificial segments 144 to leave the plurality of cavities 148 in their place, a control of the formation of the plurality of cavities 148 may also be achieved.

In some embodiments, the second removal process may not remove the entirety of the plurality of second sacrificial segments 144 from between the sidewalls of the plurality of dielectric liner segments 140. Thus, in such embodiments, one or more portions of the plurality of second sacrificial segments 144 may remain on one or more sidewalls of the plurality of dielectric liner segments 140 after the second removal process (see, for example, FIG. 4).

Figure 20:
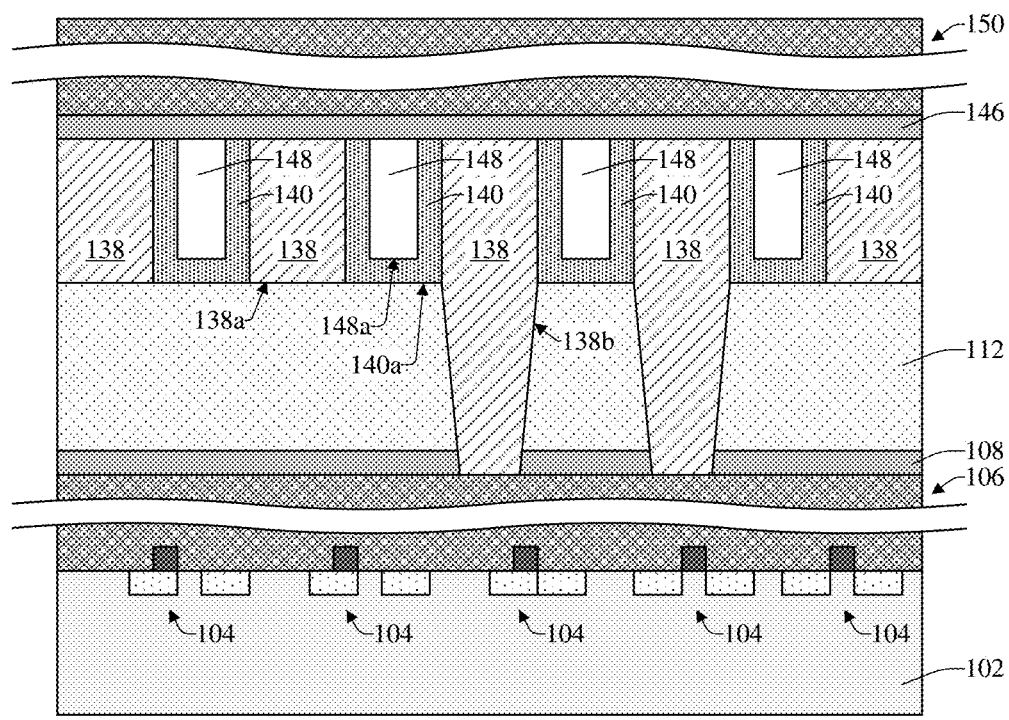

As shown in cross-sectional view 2000 of FIG. 20, a second interconnect structure 150 may be formed over the second etch-stop layer 146 and may, for example, comprise one or more metal lines, one or more metal vias, one or more bond pads, one or more solder bumps, one or more dielectric layers, or the like. Forming the second interconnect structure 150 may, for example, comprise depositing one or more dielectric layers over the second etch-stop layer 146, patterning the one or more dielectric layers to form one or more openings in the one or more dielectric layers, and depositing one or more metals in the one or more openings. Any of the one or more metal lines, one or more metal vias, one or more bond pads, one or more solder bumps, or the like may be electrically connected to any of the plurality of metal features 138.

Figure 21:
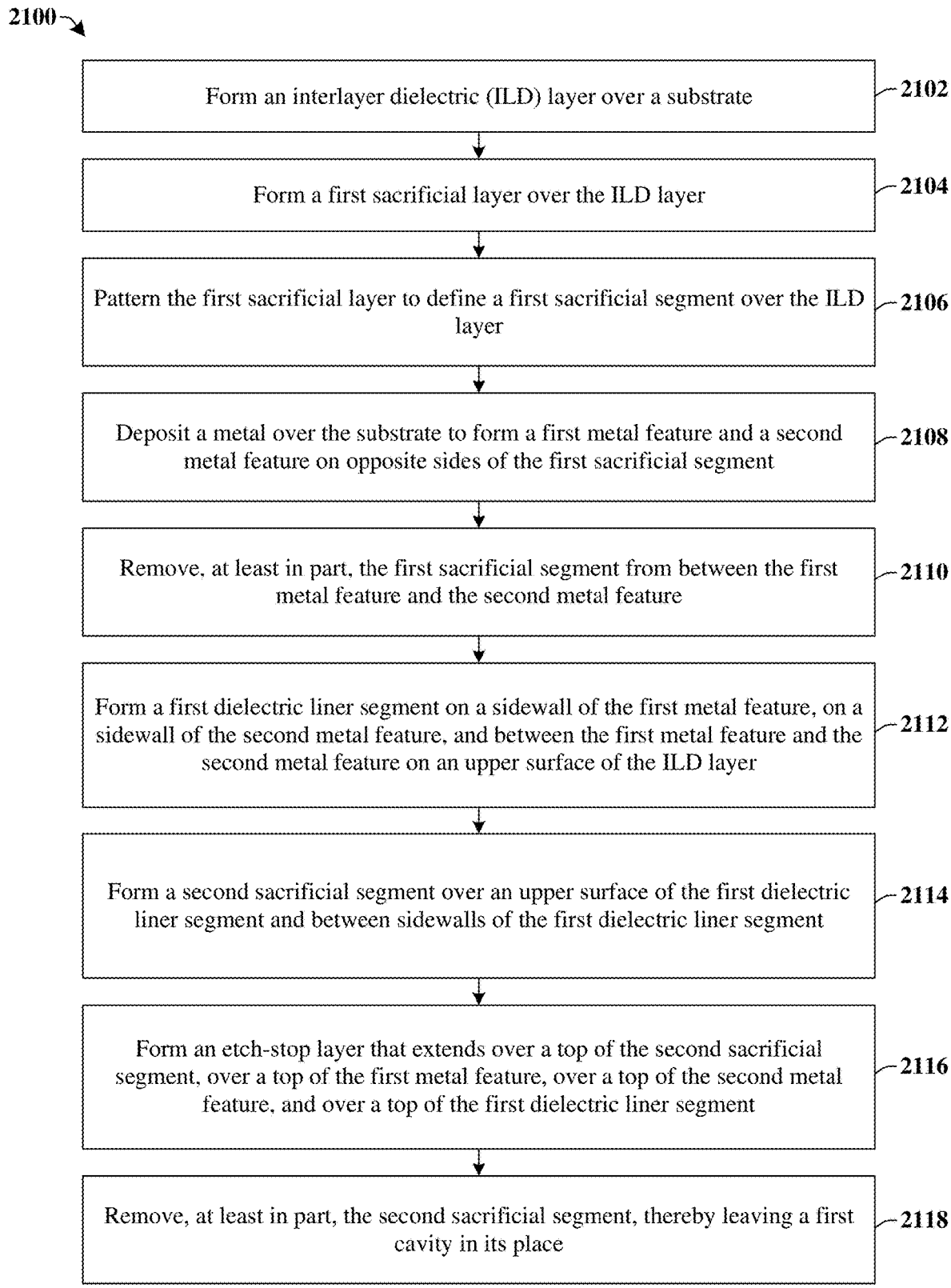
FIG. 21 illustrates a flow diagram of some embodiments of a method for forming an integrated chip comprising a first cavity between a first metal feature and a second metal feature.

FIG. 21 illustrates a flow diagram of some embodiments of a method 2100 for forming an integrated chip comprising a first cavity between a first metal feature and a second metal feature. While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2102, an interlayer dielectric (ILD) layer is formed over a substrate. FIG. 6 illustrates a cross-sectional view 600 of some embodiments corresponding to act 2102.

At 2104, a first sacrificial layer is formed over the ILD layer. FIG. 6 illustrates a cross-sectional view 600 of some embodiments corresponding to act 2104.

At 2106, the first sacrificial layer is patterned to define a first sacrificial segment over the ILD layer. FIGS. 7 and 8 illustrate cross-sectional views 700 and 800 of some embodiments corresponding to act 2106.

At 2108, a metal is deposited over the substrate to form a first metal feature and a second metal feature on opposite sides of the first sacrificial segment. FIGS. 13 and 14 illustrate cross-sectional views 1300 and 1400 of some embodiments corresponding to act 2108.

At 2110, the first sacrificial segment is removed, at least in part, from between the first metal feature and the second metal feature. FIG. 15 illustrates a cross-sectional view 1500 of some embodiments corresponding to act 2110.

At 2112, a first dielectric liner segment is formed on a sidewall of the first metal feature, on a sidewall of the second metal feature, and between the first metal feature and the second metal feature on an upper surface of the ILD layer. FIGS. 16 and 17 illustrate cross-sectional views 1600 and 1700 of some embodiments corresponding to act 2112.

At 2114, a second sacrificial segment is formed over an upper surface of the first dielectric liner segment and between sidewalls of the first dielectric liner segment. FIGS. 16 and 17 illustrate cross-sectional views 1600 and 1700 of some embodiments corresponding to act 2114.

At 2116, an etch-stop layer is formed over a top surface of the second sacrificial segment, over a top surface of the first metal feature, over a top surface of the second metal feature, and over a top surface of the first dielectric liner segment. FIG. 18 illustrates a cross-sectional view 1800 of some embodiments corresponding to act 2116.

At 2118, the second sacrificial segment is removed, at least in part, thereby leaving a first cavity in its place. FIG. 19 illustrates a cross-sectional view 1900 of some embodiments corresponding to act 2118.

Thus, various embodiments of the present disclosure are related to an integrated chip comprising a first cavity between a first metal feature and a second metal feature for reducing a capacitance between the first metal feature and the second metal feature, thereby improving a performance of the integrated chip. Further, various embodiments of the present disclosure are related to a method for forming the integrated chip that provides for control over the formation of the first cavity.

Accordingly, in some embodiments, the present disclosure relates to an integrated chip. The integrated chip comprises a dielectric layer over a substrate. A first metal feature is over the dielectric layer. A second metal feature is over the dielectric layer and is laterally adjacent to the first metal feature. A first dielectric liner segment extends laterally between the first metal feature and the second metal feature along an upper surface of the dielectric layer. The first dielectric liner segment extends continuously from along the upper surface of the dielectric layer, to along a sidewall of the first metal feature that faces the second metal feature, and to along a sidewall of the second metal feature that faces the first metal feature. A first cavity is laterally between sidewalls of the first dielectric liner segment and is above an upper surface of the first dielectric liner segment.

In other embodiments, the present disclosure relates to a method of forming an integrated chip. The method comprises forming a first metal feature and a second metal feature over a substrate. A first dielectric liner segment is formed between the first metal feature and the second metal feature, and along sidewalls of the first metal feature and the second metal feature. A sacrificial segment is formed between the sidewalls of the first metal feature and the second metal feature, and further between sidewalls of the first dielectric liner segment. An etch-stop layer is formed over the first metal feature, over the second metal feature, over the sacrificial segment, and over the first dielectric liner segment. At least part of the sacrificial segment is removed from between the sidewalls of the first metal feature and the second metal feature and from between the sidewalls of the first dielectric liner segment, thereby leaving a first cavity in place where the at least part of the sacrificial segment has been removed.

In yet other embodiments, the present disclosure relates to a method for forming an integrated chip. The method comprises forming an interlayer dielectric (ILD) layer over a substrate. A first sacrificial layer is formed over the ILD layer. The first sacrificial layer is patterned to define a first sacrificial segment over the ILD layer. The ILD layer is patterned to form an opening in the ILD layer. A metal is deposited over the substrate to form a first metal feature and a second metal feature on opposite sides of the first sacrificial segment. The first metal feature extends from a top surface of the first sacrificial segment to a bottom surface of the first sacrificial segment. The second metal feature extends from the top surface of the first sacrificial segment to below a bottom surface of the ILD layer. The first sacrificial segment is removed, at least in part, from between the first metal feature and the second metal feature. A first dielectric liner segment is formed on a sidewall of the first metal feature that faces the second metal feature, on a sidewall of the second metal feature that faces the first metal feature, and between the first metal feature and the second metal feature on an upper surface of the ILD layer. A second sacrificial segment is formed over an upper surface of the first dielectric liner segment and between sidewalls of the first dielectric liner segment. An etch-stop layer is formed over a top surface of the second sacrificial segment, over a top surface of the first metal feature, over a top surface of the second metal feature, and over a top surface of the first dielectric liner segment. The second sacrificial segment is removed, at least in part, from over the upper surface of the first dielectric liner segment, thereby leaving a first cavity in its place. The first cavity is defined by the sidewalls of the first dielectric liner segment, the upper surface of the first dielectric liner segment, and a lower surface of the etch-stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, the method comprising:
   depositing a dielectric layer over a substrate;
   forming a first sacrificial segment, a second sacrificial segment, and a third sacrificial segment over the dielectric layer, wherein the first sacrificial segment is laterally between the second sacrificial segment and the third sacrificial segment;
   patterning the dielectric layer to form an opening in the dielectric layer between the first sacrificial segment and the third sacrificial segment, wherein a sidewall of the dielectric layer delimits the opening in the dielectric layer, and wherein a topmost surface of the dielectric layer continuously extends from the second sacrificial segment to the first sacrificial segment and to the sidewall of the dielectric layer that delimits the opening in the dielectric layer after the patterning;
   forming a first metal feature and a second metal feature on opposite sides of the first sacrificial segment, the second metal feature extending from above a bottom surface of the first sacrificial segment to below the bottom surface of the first sacrificial segment;
   removing the first sacrificial segment from between the first metal feature and the second metal feature;
   forming a first dielectric liner segment between the first metal feature and the second metal feature and along sidewalls of the first metal feature and the second metal feature;
   forming a fourth sacrificial segment between the sidewalls of the first metal feature and the second metal feature, and further between sidewalls of the first dielectric liner segment;
   forming an etch-stop layer over the first metal feature, over the second metal feature, over the fourth sacrificial segment, and over the first dielectric liner segment; and
   removing at least part of the fourth sacrificial segment from between the sidewalls of the first metal feature and the second metal feature and from between the sidewalls of the first dielectric liner segment, thereby leaving a first cavity in place where the at least part of the fourth sacrificial segment has been removed.

2. The method of claim 1, wherein the first cavity is defined by the sidewalls of the first dielectric liner segment, an upper surface of the first dielectric liner segment, and a lower surface of the etch-stop layer.

3. The method of claim 1, wherein forming the first dielectric liner segment and the fourth sacrificial segment comprises:
   forming a dielectric liner layer over the first metal feature, over the second metal feature, and on the sidewalls of the first metal feature and the second metal feature;
   forming a sacrificial layer between sidewalls of the dielectric liner layer and over the dielectric liner layer; and
   performing a planarization process into the sacrificial layer and the dielectric liner layer after forming the sacrificial layer to define the fourth sacrificial segment and to define the first dielectric liner segment.

4. The method of claim 1, wherein removing the fourth sacrificial segment comprises a heating process and occurs with the etch-stop layer in place over the fourth sacrificial segment.

5. The method of claim 1, wherein the etch-stop layer remains over the fourth sacrificial segment during the removing of the fourth sacrificial segment.

6. The method of claim 1, wherein the removing of the fourth sacrificial segment comprises:
   heating the fourth sacrificial segment until the fourth sacrificial segment transforms into a gas; and
   removing the gas from the first cavity by extracting the gas through the etch-stop layer.

7. The method of claim 1, further comprising:
   forming one or more openings in the etch-stop layer before removing at least part of the fourth sacrificial segment.

8. The method of claim 1, wherein the first metal feature is disposed directly between the second sacrificial segment and the first sacrificial segment and a bottommost surface of the first metal feature extends along the topmost surface of the dielectric layer from the second sacrificial segment to the first sacrificial segment, and wherein the second metal feature is disposed directly between the first sacrificial segment and the third sacrificial segment and a bottommost surface of the second metal feature is disposed below the bottommost surface of the first metal feature.

9. A method for forming an integrated chip, the method comprising:
   forming an interlayer dielectric (ILD) layer over a substrate;
   forming a first sacrificial layer over the ILD layer;
   patterning the first sacrificial layer to define a first sacrificial segment over the ILD layer;
   patterning the ILD layer to form an opening in the ILD layer;
   depositing a metal over the substrate to form a first metal feature and a second metal feature on opposite sides of the first sacrificial segment, wherein the first metal feature extends from a top surface of the first sacrificial segment to a bottom surface of the first sacrificial segment, and wherein the second metal feature extends from the top surface of the first sacrificial segment to below a bottom surface of the ILD layer;
   removing, at least in part, the first sacrificial segment from between the first metal feature and the second metal feature;
   forming a first dielectric liner segment on a sidewall of the first metal feature that faces the second metal feature, on a sidewall of the second metal feature that faces the first metal feature, and between the first metal feature and the second metal feature on an upper surface of the ILD layer;

forming a second sacrificial segment over an upper surface of the first dielectric liner segment and between sidewalls of the first dielectric liner segment;

forming an etch-stop layer over a top surface of the second sacrificial segment, over a top surface of the first metal feature, over a top surface of the second metal feature, and over a top surface of the first dielectric liner segment; and removing, at least in part, the second sacrificial segment from over the upper surface of the first dielectric liner segment, thereby leaving a first cavity in its place, wherein the first cavity is defined by the sidewalls of the first dielectric liner segment, the upper surface of the first dielectric liner segment, and a lower surface of the etch-stop layer.

10. The method of claim 9, further comprising:
forming a hard mask over the first sacrificial layer after forming the first sacrificial layer, wherein patterning the first sacrificial layer also patterns the hard mask to form a hard mask segment over the first sacrificial segment.

11. The method of claim 10, further comprising:
performing a planarization process into the hard mask segment and the metal after depositing the metal to define the first metal feature, to define the second metal feature, and to remove the hard mask segment from over the first sacrificial segment.

12. The method of claim 9, wherein the etch-stop layer is in place over the second sacrificial segment during the removing of the second sacrificial segment.

13. A method for forming an integrated chip, the method comprising:
depositing a first sacrificial layer over a dielectric layer that is over a substrate;
patterning the first sacrificial layer to form a first sacrificial segment, a second sacrificial segment, and a third sacrificial segment from the first sacrificial layer that are laterally spaced apart over the dielectric layer, wherein the second sacrificial segment is laterally between the first sacrificial segment and the third sacrificial segment;
patterning the dielectric layer between the second sacrificial segment and the third sacrificial segment to form an opening in the dielectric layer, wherein the opening is delimited by sidewalls of the dielectric layer;
depositing a metal between the first sacrificial segment and the second sacrificial segment to form a first metal feature between the first sacrificial segment and the second sacrificial segment, wherein a bottommost surface of the first metal feature is disposed on a topmost surface of the dielectric layer from the first sacrificial segment to the second sacrificial segment;
depositing the metal between the second sacrificial segment and the third sacrificial segment and in the opening in the dielectric layer to form a second metal feature directly between the second sacrificial segment and the third sacrificial segment and directly between the sidewalls of the dielectric layer, wherein the second metal feature extends below the bottommost surface of the first metal feature;
removing, at least in part, the second sacrificial segment from between the first metal feature and the second metal feature;

depositing a dielectric liner layer along a sidewall of the first metal feature that faces the second metal feature, along a sidewall of the second metal feature that faces the first metal feature, and between the first metal feature and the second metal feature along an upper surface of the dielectric layer;

depositing a second sacrificial layer over a first upper surface of the dielectric liner layer and between opposing sidewalls of the dielectric liner layer;

removing a portion of the second sacrificial layer and a portion of the dielectric liner layer to form a fourth sacrificial segment and a dielectric liner segment from the second sacrificial layer and the dielectric liner layer, respectively, the fourth sacrificial segment and the dielectric liner segment arranged between the first metal feature and the second metal feature;

depositing an etch-stop layer over a top surface of the fourth sacrificial segment, over a top surface of the first metal feature, over a top surface of the second metal feature, and over a second upper surface of the dielectric liner segment; and removing, at least in part, the fourth sacrificial segment from over the first upper surface of the dielectric liner segment, from between opposing sidewalls of the dielectric liner segment, and from below a lower surface of the etch-stop layer, thereby leaving a first cavity in place of the second sacrificial layer.

14. The method of claim 13, wherein removing the fourth sacrificial segment from over the first upper surface of the dielectric liner segment, from between the opposing sidewalls of the dielectric liner segment, and from below the lower surface of the etch-stop layer comprises heating the fourth sacrificial segment so the fourth sacrificial segment undergoes thermal decomposition.

15. The method of claim 13, wherein removing the second sacrificial segment from between the first metal feature and the second metal feature comprises etching the second sacrificial segment.

16. The method of claim 13, wherein depositing the first sacrificial layer comprises depositing a first material and depositing the second sacrificial layer comprises depositing a second material different from the first material.

17. The method of claim 13, wherein patterning the first sacrificial layer comprises forming a hard mask layer on the first sacrificial layer and etching the hard mask layer and the first sacrificial layer to form the first sacrificial segment, the second sacrificial segment, and the third sacrificial segment with respective hard mask segments thereon, and
wherein patterning the dielectric layer comprises etching the dielectric layer with the first sacrificial segment, the second sacrificial segment, the third sacrificial segment, and the respective hard mask segments in place to form the opening in a portion of the dielectric layer that is directly below a spacing between the second sacrificial segment and the third sacrificial segment.

18. The method of claim 13, further comprising:
forming a masking layer directly between the first sacrificial segment and the second sacrificial segment before the patterning of the dielectric layer, wherein the masking layer remains directly between the first sacrificial segment and the second sacrificial segment during the patterning of the dielectric layer to protect the dielectric layer between the first sacrificial segment and the second sacrificial segment from the patterning.

19. The method of claim 13, wherein a topmost surface of the first metal feature, a topmost surface of the second metal feature, and a topmost surface of the first sacrificial segment are disposed at a first height over the substrate, wherein the bottommost surface of the first metal feature and a bottommost surface of the first sacrificial segment are disposed at a second height over the substrate, less than the first height, and wherein a bottommost surface of the second metal feature is disposed at a third height over the substrate, less than the second height.

20. The method of claim 13, wherein the first metal feature extends from a topmost surface of the first sacrificial segment to a bottommost surface of the first sacrificial segment, and wherein the second metal feature extends from the topmost surface of the first sacrificial segment to below a bottommost surface of the dielectric layer.

* * * * *